(12) United States Patent
Zeng et al.

(10) Patent No.: US 11,899,229 B2
(45) Date of Patent: Feb. 13, 2024

(54) METHOD AND APPARATUS FOR PREPARING FEMTOSECOND OPTICAL FILAMENT INTERFERENCE DIRECT WRITING VOLUME GRATING/CHIRPED VOLUME GRATING

(71) Applicants: Chongqing Institute of East China Normal University, Chongqing (CN); ROI Optoelectronics Technology CO, LTD., Shanghai (CN); East China Normal University, Shanghai (CN)

(72) Inventors: Heping Zeng, Chongqing (CN); Junyi Nan, Chongqing (CN); Mengyun Hu, Chongqing (CN); Ming Yan, Chongqing (CN)

(73) Assignees: CHONGQING INSTITUTE OF EAST CHINA NORMAL UNIVERSITY, Chongqing (CN); ROI OPTOELECTRONICS TECHNOLOGY CO, LTD., Shanghai (CN); EAST CHINA NORMAL UNIVERSITY, Shanghai (CN)

( * ) Notice: Subject to any disclaimer, the term of this patent is extended or adjusted under 35 U.S.C. 154(b) by 450 days.

(21) Appl. No.: 17/230,428

(22) Filed: Apr. 14, 2021

(65) Prior Publication Data

US 2021/0325581 A1 Oct. 21, 2021

(30) Foreign Application Priority Data

Apr. 15, 2020 (CN) .......................... 202010293703.3

(51) Int. Cl.
*G02B 5/18* (2006.01)
*G03H 1/04* (2006.01)
*G03H 1/02* (2006.01)

(52) U.S. Cl.
CPC ......... *G02B 5/1857* (2013.01); *G03H 1/0402* (2013.01); *G03H 2001/0268* (2013.01); *G03H 2222/33* (2013.01); *G03H 2240/52* (2013.01); *G03H 2260/62* (2013.01)

(58) Field of Classification Search
CPC ............... G02B 5/1857; G03H 1/0402; G03H 2001/0268; G03H 2222/33; G03H 2240/52; G03H 2260/62
USPC .............................................. 365/106; 430/1
See application file for complete search history.

(56) References Cited

U.S. PATENT DOCUMENTS

| | | | | |
|---|---|---|---|---|
| 5,761,111 | A * | 6/1998 | Glezer ................. | G11B 7/0045 365/127 |
| 2006/0019171 | A1* | 1/2006 | Hosono .................... | G03H 1/04 430/1 |
| 2019/0103720 | A1* | 4/2019 | Froula ................. | H01S 3/09716 |

* cited by examiner

*Primary Examiner* — Audrey Y Chang
(74) *Attorney, Agent, or Firm* — Hodgson Russ LLP

(57) ABSTRACT

The present disclosure discloses a method and apparatus for preparing a femtosecond optical filament interference direct writing volume grating/chirped volume grating. The method is characterized in that optical filaments are formed in glass by using femtosecond pulse laser, and plasma is controlled to quickly scan in the glass and etch a volume grating or chirped volume grating structure by adjusting the focal length of convex lens, laser energy and movement of motor machine. The apparatus includes a femtosecond pulse laser module, a pulse chirp management module, a pulse time domain shaping module, a laser separation and interference module, a glass volume grating processing platform module and a camera online imaging module.

10 Claims, 4 Drawing Sheets

METHOD AND APPARATUS FOR PREPARING FEMTOSECOND OPTICAL FILAMENT INTERFERENCE DIRECT WRITING VOLUME GRATING/CHIRPED VOLUME GRATING

CROSS-REFERENCE TO RELATED APPLICATIONS

This application claims priority to Chinese Patent Application Serial No. 202010293703.3 filed on Apr. 15, 2020, the entire contents of which are incorporated by reference herein.

FIELD

The present disclosure relates to the field of optical diffraction element manufacturing, and more particularly, to a method and apparatus for preparing a femtosecond optical filament interference direct writing volume grating and a chirped volume grating.

BACKGROUND

Grating devices have the property of diffracting incident light beam, can be used for beam splitting, pulse broadening, pulse compression and the like, and thus are widely applied to the fields of spectrum measurement, optical calculation, optical information processing and laser amplification systems. At present, common grating manufacturing methods include mechanical scribing, ion beam scribing, template replication, and holographic illumination method, among which the holographic method is more popular due to its high production efficiency and relatively low cost. The holographic method is implemented in such a way that periodic interference fringes are projected on surface of or inside a photosensitive glass through interference of two laser beams, holographic images are recorded on the glass after exposure, and a grating can be formed through professional treatment. Chirped gratings, volume gratings and chirped volume Bragg gratings are gradually derived from the holographic method, which is conductive to the development of ultrafast optics and high-power laser systems.

Chinese patent document CN 108415111 A describes a method for preparing a chirped volume grating using photothermal refractive glass, in which interference fringes with gradually changing pitches are recorded in the photothermal refractive glass and then heat-treated to prepare the chirped volume grating. The method is limited by the size of a light spot and the space walk-off, and the thickness of the prepared grating cannot meet more requirements. In addition, the glass materials applied in holographic method are limited with photosensitive glass and thermal refractive glass. Thus, holographic method cannot be applied in processing infrared quartz, fused quartz and other functional materials.

With the development of femtosecond pulse laser technology, the advantages of nanoscale machining precision, low thermal effect and accurate damage threshold of laser ablation technology make ultrafast laser machining applied to high-precision optical machining and grating preparation. In the traditional ultra-fast laser processing technique, the laser is converged into a micro-scale small light spot by using a focusing objective lens, then the position of a sample to be processed is moved, and the path scanned by the laser is the shape to be processed. It is easy to machine any planar structure with the machining method, but the accuracy of the path scanned by the laser has higher requirements on the movement stability of a motor machine, and the point-by-point ablation manner is not highly effective for large-area grating preparation.

The glass volume grating in the related technique is complex in preparation process, high in production cost and insufficient in quality stability.

SUMMARY

A method for preparing a femtosecond optical filament interference direct writing volume grating and a chirped volume grating is provided. In this method, femtosecond pulse laser is configured to interfere in glass to form a section of optical filament that is several times of Rayleigh length in length; plasma is controlled to rapidly scan in the glass and etch out a structure of the volume grating or the chirped volume grating by adjusting a focal length of convex lens, laser energy and movement of motor machine; and the femtosecond pulse laser has two or more beams.

DETAILED DESCRIPTION

Figure 1:
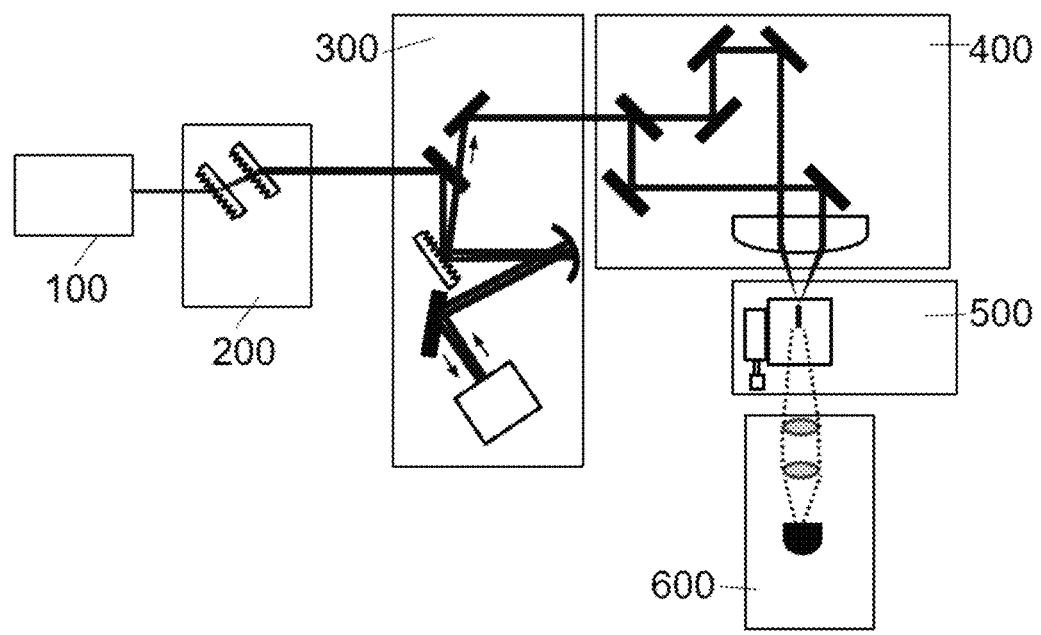
FIG. 1 is a structural diagram of an apparatus for preparing a volume grating of the present disclosure.

The present disclosure aims to design a method and apparatus for preparing a femtosecond optical filament interference direct writing volume grating and a chirped volume grating, in view of the defects of the related technique. Two or more beams of pulse laser are configured to interfere in glass to form a plasma grating or a chirped plasma grating, and then the plasma is controlled to rapidly scan in the glass and etch out a structure of the volume grating or the chirped volume grating. When the peak power intensity of the femtosecond pulse laser in the glass is above the ionization threshold, the multiphoton ionization of the medium is caused to generate plasma, the nonlinear Kerr self-focusing effect is balanced with the self-defocusing of the plasma, and optical filament that is several times of Rayleigh length in length is formed in the glass. The structure of the glass can be changed by the laser pulse with high peak power while forming the optical filament, and the length of the optical filament in the glass can easily reach several centimeters by adjusting the focal length of the focusing lens and the laser energy. The processing of the volume grating in the glass can be quickly finished through the optical filament formed in the glass by the femtosecond pulse laser, the manufacturing process of the volume grating can be greatly simplified, the cost of the preparation of the volume grating can be effectively reduced by the design of an integrated apparatus, and a new preparation method can be provided for the manufacture of the volume grating, the chirped volume grating with various designed characters in large numerical aperture, different scribing sizes and different glass materials.

The specific technical solution for achieving the purpose of the present disclosure is a method for preparing a femtosecond optical filament interference direct writing volume grating/chirped volume grating, wherein femtosecond pulse laser is configured to interfere in glass to form a section of optical filament that is several times of Rayleigh length in length; plasma is controlled to rapidly scan in the glass and etch out a structure of the volume grating or the chirped volume grating by adjusting a focal length of a convex lens and laser energy; and the femtosecond pulse laser is multi-beam laser having two or more beams and a peak power intensity above ionization threshold.

An apparatus for preparing a femtosecond optical filament interference direct writing volume grating/chirped volume grating with the above method includes a femtosecond pulse laser module, a pulse chirp management module, a pulse time domain shaping module, a laser separation and interference module, a glass volume grating processing platform module and a camera online imaging module.

The femtosecond pulse laser module provides femtosecond pulse laser with high peak power which is incident to the pulse chirp management module; the pulse chirp management module manages time domain chirp or spatial dispersion of femtosecond pulse laser, and the laser pulse is incident to the laser separation and interference module after being managed; the pulse time domain shaping module manages a time domain waveform of the femtosecond pulse laser and controls a spatial distribution of the formed plasma grating; the laser separation and interference module separates the incident laser into two or more beams, the separated multi-beam pulses are respectively synchronized in time domain after passing through a planar mirror, the separated multi-beam pulses reunite at a focal point after passing through a converging lens to generate interference, and a plasma grating or a chirped plasma grating is formed in a glass sample; the glass volume grating processing platform module is a precise electrically controlled displacement platform and controls a glass sample to move so as to complete laser processing of the glass volume grating; and the camera online imaging module observes the processing condition of the laser in the glass sample in real time.

The femtosecond pulse laser module includes: an adjustable power attenuator and a high single pulse energy femtosecond laser or a picosecond laser, wherein the high single pulse energy laser is a solid laser or an optical filament laser, a pulse width is femtosecond, a frequency of repetition rate is 0.01-100 kHz with a center wavelength in the range from ultraviolet to near infrared, and the adjustable power attenuator is used for changing a power of an output laser and can be a neutral density attenuation plate, a half-wave plate combined with a Glan prism or a half-wave plate combined with polarization beam splitter.

The pulse chirp management module includes: a first diffraction grating, a second diffraction grating, a mirror with high reflectivity at incident angle of 0°, a first planar mirror and a second planar mirror, wherein the first diffraction grating and the second diffraction grating are the same in specification and can be a transmitted diffraction grating, a reflective diffraction grating, a dispersion prism or other dispersion devices which are not limited to the diffraction grating, and the diffraction grating is used for modulating chirp of incident laser; and the mirror with high reflectivity at incident angle of 0° is fixed on the sliding rail and placed behind the second diffraction grating. When the pulse modulated by the diffraction grating does not pass through the 0° mirror, the pulse chirp management module is used for modulating spatial dispersion of the laser pulse at the moment; when the pulse modulated by the diffraction grating is reflected back with the original path by the 0° mirror, the pulse chirp management module at the moment is used for modulating time domain dispersion of the laser pulse, and the laser pulse enters the laser separation and interference module after being modulated by the pulse chirp management module. The spatial dispersion laser pulse modulated by the pulse chirp management module is characterized in that photons with different wavelength components in the wavefront plane of a light spot are sequentially scattered from a short wavelength to a long wavelength in space, and two or more beams of the spatial dispersion laser pulses are focused in a glass sample at a certain included angle after time domain synchronization. A section of the same wavelength between several spots overlap at the focal point, and photons at different spatial distributions between spots but of the same wavelength component interfere to generate a plasma. Because the period of the plasma grating formed when photons of different wavelengths interfere is also different, several spatially dispersed pulse laser beams form a chirped plasma grating (with a period of $D_n$) with non-uniform periodic distribution at the focal point of a converging lens in a glass sample, which can be used for manufacturing the chirped volume grating. The time domain dispersion of the time domain chirped laser pulse modulated by the pulse chirp management module can be used for compensating the dispersion accumulated when the femtosecond laser propagates in space and in glass. By controlling the pulse width of the femtosecond laser and laser intensity, the length of optical filaments can be adjusted. Because the femtosecond pulse has no spatial dispersion on this condition, when the multi-beam laser pulse interferes at the focal point of the converging lens in the glass sample, a plasma grating with uniform period (period D) is formed, so that the method can be used for manufacturing the volume grating.

The pulse time domain shaping module includes: a plurality of planar mirrors, a third diffraction grating, a concave mirror and a pulse shaping template, wherein the chirped femtosecond pulse laser is incident on the third diffraction grating through the planar mirrors and is converted into parallel light beams through the concave mirrors after being diffracted; the third diffraction grating is arranged at a focal point of the concave mirror, and a parallel light beam with angular dispersion is vertically incident on the pulse shaping template reflected by the planar mirrors; after the femtosecond pulse laser is modulated by the pulse shaping template by changing the time domain pulse envelope, the femtosecond pulse laser is reflected back along the original optical path with a small angle difference, passes through the concave mirror and the third diffraction grating again to complete a pulse time domain shaping process, and finally enters the laser separation and interference module; the third diffraction grating is a transmission grating, a reflection grating, a volume grating or a dispersion prism, and is used for dispersing incident chirped femtosecond pulses in space, dividing the chirped femtosecond pulses into a plurality of beams of quasi-monochromatic light, and facilitating modulation by the pulse shaping template; the pulse shaping template is an acousto-optic modulator, a liquid crystal spatial modulator, a movable mirror or a deformable mirror, and is used for modulating amplitude and phase of the plurality of beams of quasi-monochromatic light incident on the pulse shaping template, changing a time domain pulse shape of the pulse, and manufacturing a planar volume grating, a curved volume grating and the like.

The laser separation and interference module includes: an optical path collimator, a beam splitting device, a time domain delay controller, a converging lens and a plurality of planar mirrors; the light path collimation includes: a third planar mirror and a fourth planar mirror and a first diaphragm and a second diaphragm; the first diaphragm and the second diaphragm are sequentially arranged behind the planar mirrors and are used for assisting in collimating incident laser; the beam splitting device is one or more planar beam splitters, a combination of a half-wavelength wave plate and a polarization beam splitter or a combination of a half-wavelength wave plate and a micro-array mirror, and is used for proportionally dividing pulse laser into a plurality of beams; the time domain delay controller consists of a displacement platform and two planar mirrors and is used for adjusting a time domain difference between laser pulses so as to enable the plurality of laser pulses to achieve time domain synchronization when passing through the focal point of the converging lens; the converging lens is a plano-convex cylindrical lens, a double-glued cylindrical lens, a circular lens, a micro-lens array or a conical lens and is used for simultaneously converging a plurality of laser pulses, shapes of plasma gratings formed by different kinds of converging lenses are also different, and the focal point of the converging lens is placed on a glass sample to be processed; the converging lenses have different focal lengths, and a length of the plasma grating formed in the glass is positively correlated with the focal length after the pulse laser is converged by the lenses with different focal lengths; the converging lens is arranged on one movable sliding rail and used for matching a distance between the lens and the glass sample; the plasma grating is formed by synchronously interfering two or more femtosecond pulse laser beams in a glass sample at a certain included angle and is formed after generating a nonlinear optical effect; a one-dimensional plasma grating is formed by interference between two or more femtosecond pulse laser beams and can be used for manufacturing a one-dimensional volume grating, especially interference among three beams of femtosecond pulse laser, the three beams of laser are in the same plane, a one-dimensional plasma grating is formed between two beams of femtosecond pulse laser with a small included angle, and the third laser beam is incident in a direction close to 90° with the plasma grating. The interaction between the optical filament formed by the third laser beam and the plasma grating formed by the interference of the other two laser beams can enhance the plasma density near the interaction area, which not only can be used for improving the uniformity of the plasma grating, but also can be used for increasing the length of the plasma grating and increasing a size of the manufactured grating.

The glass volume grating processing platform module includes: a glass sample and a precise electrically controlled displacement platform; the glass sample is a six-side polished rectangular parallelepiped, and the glass sample can be made of fused quartz glass, K9 glass, calcium fluoride glass or various other optical glasses, is not limited to the glass material mentioned above, and can also be various optical crystals such as zinc sulfide crystals or ceramic materials.

According to the precise electrically controlled displacement platform, a plurality of glass samples can be placed, and the glass volume grating can be manufactured by moving the positions of the glass samples. An included angle between a moving direction and a plane where the plasma grating is located is a, a moving path is a straight line; and etching the plasma grating in the glass sample and the plasma grating can change the structure of the glass, resulting in a change in the refractive index of a lasing region. Due to the angle $\alpha$ between the moving direction and the plasma grating, the grating period actually etched Df=D sin $\alpha$.

The camera online imaging module includes: two convex lenses with any focal length, a CCD camera and a computer with a display, wherein the two convex lenses with any focal length form a telescope system, the focal point of one end is on the glass sample, the focal point of the other end is on the CCD camera, and a data line of the CCD camera is connected to the computer with the display, so that real-time imaging in the glass processing process is realized.

Compared with the related technique, the method has the advantages that the processing of the volume grating in the glass can be quickly finished through the optical filament formed in the glass by the femtosecond pulse laser, the manufacturing process of the volume grating can be greatly simplified, the cost of the preparation of the volume grating can be effectively reduced by the design of an integrated apparatus, and a new preparation method can be provided for the manufacture of the volume grating and the chirped volume grating with large numerical aperture, different scribing specifications and different glass materials.

According to the method for preparing the femtosecond optical filament interference direct writing volume grating and the chirped volume grating, two or more beams of pulse laser are configured to interfere in glass to form the plasma grating or the chirped plasma grating, and then the plasma is controlled to rapidly scan in the glass and etch a structure of the volume grating or the chirped volume grating.

With reference to FIG. 1, the apparatus according to the present disclosure consists of a femtosecond pulse laser module 100, a pulse chirp management module 200, a pulse time domain shaping module 300, a laser separation and interference module 400, a glass volume grating processing platform module 500 and a camera online imaging module 600. The femtosecond pulse laser module 100 includes: a high-power femtosecond pulse laser and a circular rotary adjustable power attenuation sheet, wherein the femtosecond pulse laser is a titanium gemstone laser of a regenerative amplification system and can output horizontal linear polarization, with a center wavelength of 800 nm, a pulse width of 60 fs, a repetition frequency of 1 KHz, and a power of the femtosecond pulse laser of 4 W; and the femtosecond pulse laser is incident on the first transmission grating 201 in the pulse chirp management module 200 after passing through the adjustable attenuation sheet.

Figure 2:
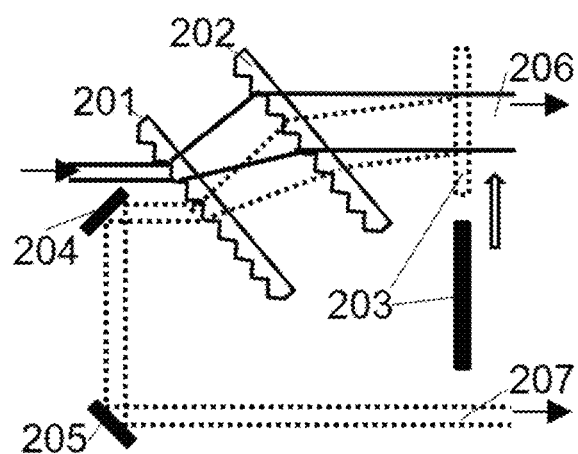
FIG. 2 is a structural diagram of a pulse chirp management module.

With reference to FIG. 2, the pulse chirp management module 200 includes: a first transmission grating 201, a second transmission grating 202, a mirror 203 with an end surface at an angle of 0°, a first planar mirror 204 and a second planar mirror 205. The femtosecond pulse laser incident to the pulse chirp management module 200 is diffracted by the first transmission grating 201 and then incident to the second transmission grating 202, and the second transmission grating 202 outputs the incident laser into a collimated and space angle dispersion-modulated pulse laser beam 206 for manufacturing a chirped volume grating. The mirror 203 with an end surface at an angle of 0° is moved so that the pulse laser 206 is reflected back by the original optical path, sequentially passes through the second transmission grating 202 and the first transmission grating 201, is changed in path by the first planar mirror 204 and the second planar mirror 205, is output as the pulse laser beam 207 for manufacturing the volume grating, and is incident to the third planar mirror 301 in the pulse time domain shaping module 300. By varying parallel spacing between the first transmission grating 201 and the second transmission grating 202, a magnitude of the time domain chirp can be adjusted.

Figure 3:
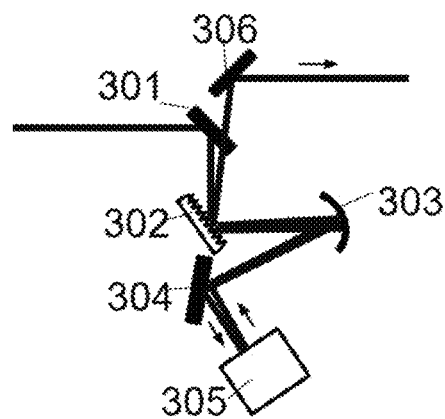
FIG. 3 is a structural diagram of a pulse time domain shaping module.

With reference to FIG. 3, the pulse time domain shaping module 300 includes: a third planar mirror 301, a fourth planar mirror 304, a fifth planar mirror 306, a third diffraction grating 302, a concave mirror 303 and a pulse shaping template 305. After the path of the pulse laser beam 207 entering the pulse time domain shaping module 300 is changed by the third planar mirror 301, the pulse laser beam 207 is incident on the third diffraction grating 302, diffracts and generates angular dispersion to become a plurality of beams of quasi-monochromatic light distributed in space lines. The third diffraction grating 302 is placed at the focal point of the concave mirror 303. The plurality of beams of quasi-monochromatic light are converted into a collimated beam through the concave mirror 303 and then incident on the pulse shaping template 305 through the fourth planar mirror 304. The pulse shaping template 305 modulates the time domain Gaussian-distributed laser into the time domain rectangular-distributed laser, the modulated laser returns according to the original optical path with a small angle difference, and the modulated laser sequentially passes through the pulse shaping template 305, the fourth planar mirror 304, the concave mirror 303 and the third diffraction grating 302. Finally, the time domain rectangular-distributed laser is output by the fifth planar mirror 306 and is incident on the sixth planar mirror 401 in the laser separation and interference module 400.

Figure 4:
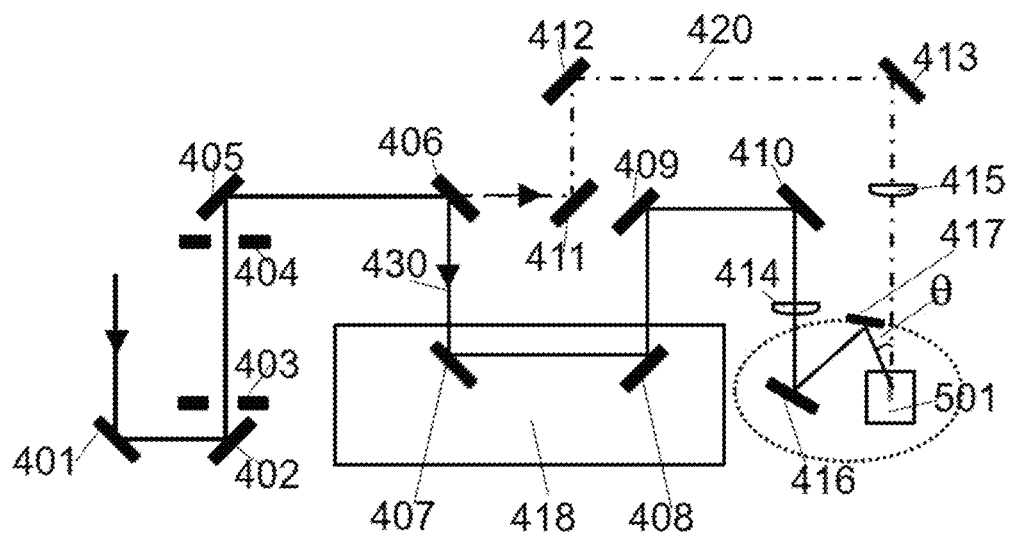
FIG. 4 is a structural diagram of a volume grating processing platform module.

With reference to FIG. 4, the laser separation and interference module 400 includes: a seventh planar mirror 401, an eighth planar mirror 402, a ninth planar mirror 405, a first diaphragm 403, a second diaphragm 404, a tenth planar mirror 407, an eleventh planar mirror 408, a twelfth planar mirror 409, a thirteenth planar mirror 410, a fourteenth planar mirror 416, a fifteenth planar mirror 417, a sixteenth planar mirror 411, a seventeenth planar mirror 412, an eighteenth planar mirror 413, a one-to-one beam splitter mirror 406, a displacement stage 418, a reflected beam 430, a transmitted beam 420, a first plano-convex cylindrical lens 414, and a second plano-convex cylindrical lens 415. The centers of the backs of the seventh planar mirror 401, the eighth planar mirror 402 and the ninth planar mirror 405 are respectively provided with a photoelectric probe, and when laser passes through the center of the planar mirror, the photoelectric probe responds; the first diaphragm 403 and the second diaphragm 404 are used to assist in collimating the light beam. The time domain rectangular-distributed laser incident into the laser separation and interference module 400 is collimated and position-calibrated through the seventh planar mirror 401, the eighth planar mirror 402 and the ninth planar mirror 405, and is divided into a reflected beam 430 and a transmitted beam 420 with equal power by the one-to-one beam splitter mirror 406. The reflected beam 430 passes through a time domain delay controller consisting of a tenth planar mirror 407, an eleventh planar mirror 408, and a displacement stage 418, and then the laser is redirected by the twelfth planar mirror 409, the thirteenth planar mirror 410, and converged into the glass sample 501 by the first plano-convex cylindrical lens 414 via the fourteenth planar mirror 416 and the fifteenth planar mirror 417. The transmitted beam 420 is redirected through the sixteenth planar mirror 411, the seventeenth planar mirror 412, and the eighteenth planar mirror 413 and then converged into the glass sample 501 by the second plano-convex cylindrical lens 415. The first plano-convex cylindrical lens 414 and the second plano-convex cylindrical lens 415 are confocal, and an included angle between the reflected beam and the transmitted beam is θ. A fourteenth planar mirror 416 and a fifteenth planar mirror 417 are disposed between the first plano-convex cylindrical lens 414 and the focal point.

With reference to FIG. 4, the focal point of the first plano-convex cylindrical lens 414 and the center of the fourteenth planar mirror 416 are on two focal points of an ellipse, respectively, and the center of the fifteenth planar mirror 417 is on the circumference of the ellipse. Using the property of an ellipse, when the center of the fifteenth planar mirror 417 is always on the circumference of the ellipse, the optical paths through the fourteenth planar mirror 416 and the fifteenth planar mirror 417 do not change, facilitating the change of the included angle θ. Moving the displacement stage 418 appropriately, when the reflected beam 430 and the transmitted beam 420 are synchronized in the time domain and the peak power density of the laser reaches above the ionization threshold of the glass sample 501, a uniformly spaced plasma grating is formed in the glass sample 501 at the focal point with a spacing $D=\lambda/\sin(\theta/2)$.

Figure 5:
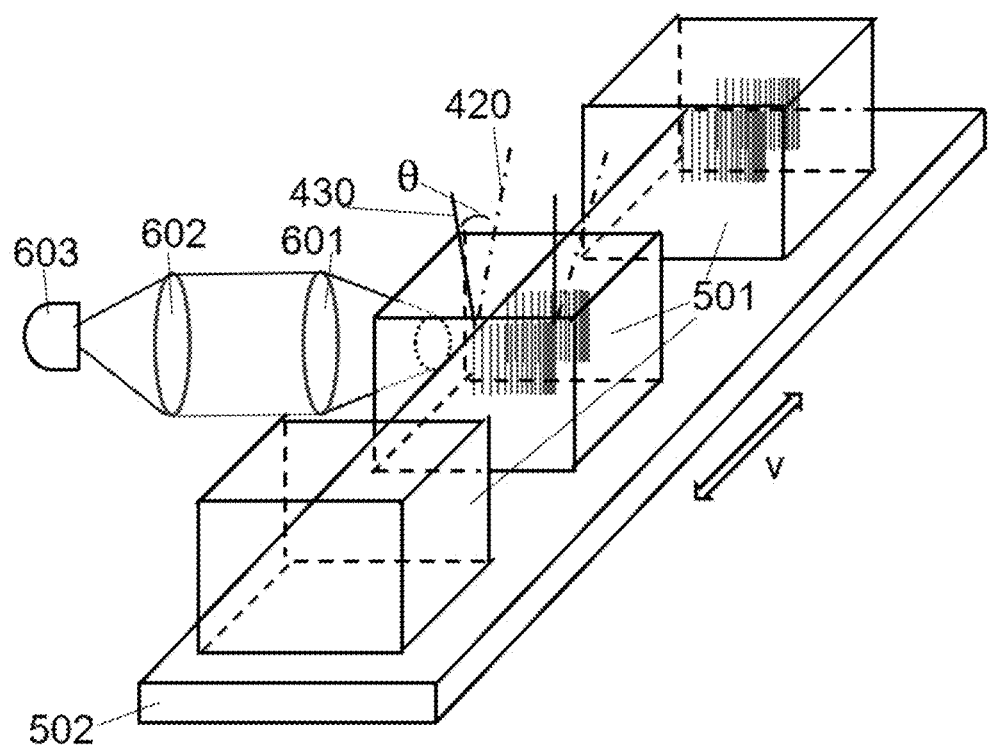
FIG. 5 is a structural diagram of a laser separation and interference module.

With reference to FIG. 5, the glass volume grating processing platform module 500 includes: a glass sample 501 and a precise electrically controlled displacement platform 502; the camera online imaging module 600 includes: a first convex lens 601, a second convex lens 602, and a CCD camera 603; a plurality of glass samples 501 can be placed on the precise electrically controlled displacement platform 502, and the electrically controlled displacement platform 502 moves the glass samples 501 at a constant speed with the speed v=0.3 mm/s to change the action position of the plasma grating so as to complete the manufacture of the glass volume grating. The included angle between the moving direction and the plane where the plasma grating is located is α, and the moving path is a straight line. Etching of the plasma grating in the glass sample 501 and changing of the structure of the glass result in a change in the refractive index of the lasing region. Due to the included angle α between the moving direction and the plasma grating, the actual etched grating period $Df=D \sin \alpha$. According to a telescope system composed of the first convex lens 601 and the second convex lens 602, a focal point of one end of the telescope system is positioned on the glass sample 501, a focal point of the other end of the telescope system is positioned on the CCD camera 603, and a data line of the CCD camera 603 is connected to a computer with a display, so that real-time imaging in the glass processing process is realized.

Figure 6:
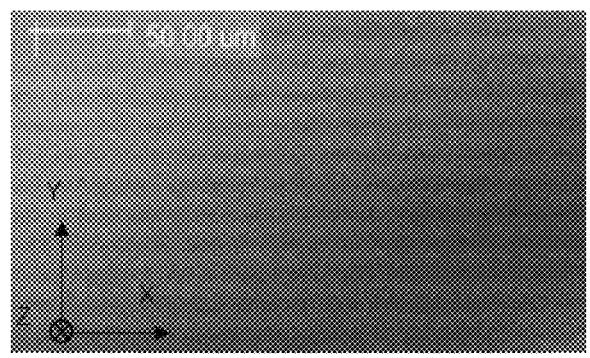
FIG. 6 is a top view of a volume grating under a microscope.

With reference to FIG. 6, a volume grating formed by ablating the plasma grating in a glass sample 501 is shown by a microscope: a grating period is about 13.1 microns, a size of the volume grating is 400 microns×450 microns in the XY plane, a size of the Z axis is depending on a height of the glass, a length of the process is controlled by the motor, the XY plane is defined parallel to the plane of the paper, and the Z axis is perpendicular to the plane of the paper inward. A center wavelength of the pulse laser adopted for manufacturing the volume grating is 800 nm, a with pulse width of about 100 femtoseconds, and two beams of time domain synchronized pulse laser with a single pulse energy of about 120 micro Joule are converged by a first plano-convex cylindrical lens 414 and a second plano-convex cylindrical lens 415 (a focal length of 150 mm) respectively. Then the plasma grating is formed in the XY plane in the glass sample 501. The electrically controlled displacement platform 502 is controlled to move at a constant speed along the Z axis at a speed v=0.3 mm/s, and the included angle α between the moving direction and the plasma grating is 90°, so that the plasma grating is ablated in the glass sample 501, the refractive index of the ablated region is increased, and a volume grating is formed. The accuracy of the volume grating in the Z axis depends on the control accuracy of a motor and the stability of an optical platform, the included angle between two laser pulses is 2.9°, the period of the plasma grating is calculated to be about 15.8 microns according to an interference formula, the actually measured grating distance is 15.5 microns, and the measured diameter of ablation of the optical filament is 5.7 microns, i.e. the duty cycle of the region of increased refractive index is about 36.7%.

Figure 7:
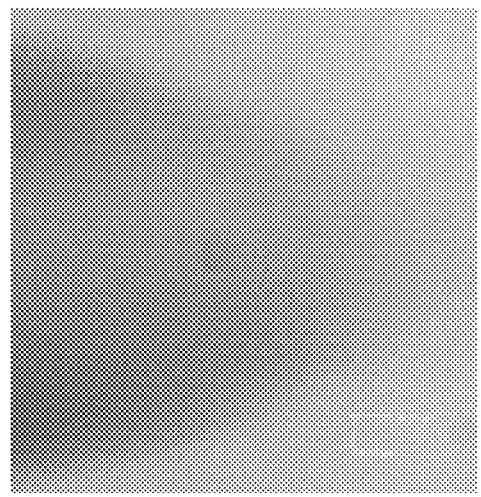
FIG. 7 is a top view of a convex volume grating under a microscope.

With reference to FIG. 7, the convex volume grating has a function of diffracting and converging an incident light spot while the grating starting point at one end is distributed according to a curved surface and the other end is kept in a plane, and the converging focus is on the center of the circle of the curved surface. The modulation parameters of the time domain shaping template 305 in the pulse time domain shaping module 300 are changed, the rectangular distributed pulse modulation is set to be quasi-semicircular distributed pulse modulation, and the pulses entering the laser separation and interference module 400 are time domain quasi-semicircular distributed laser pulses. According to the Kerr self-focusing effect, the energy of the central part of the light spot of the time domain quasi-semicircular distributed laser pulse is strong, the non-linear effect is generated firstly to generate plasma optical filaments, the energy of an edge part of the light spot is relatively weak, and the plasma optical filaments can be generated only after propagating for a distance in the glass sample 501, so that the starting positions of the optical filaments in the plasma grating formed by the interference of the time domain quasi-semicircular distributed laser pulses in the glass sample 501 are distributed in a curve. A radius of curvature is controlled by the time domain shaping template 305 and is related to the pulse chirp, the depth of focus in the glass, and the focal length of the converging lens. Then, the precise electrically controlled displacement platform 502 is controlled to move the glass sample 501 along a straight line at a constant speed of v=0.3 mm/s, and an included angle α between the moving direction and the plasma grating is formed as 90°, and a curved volume grating can be rapidly etched into the glass sample 501.

The present disclosure is described in further detail below by specific embodiments of chirped volume grating preparation.

Embodiment 1

Figure 8:
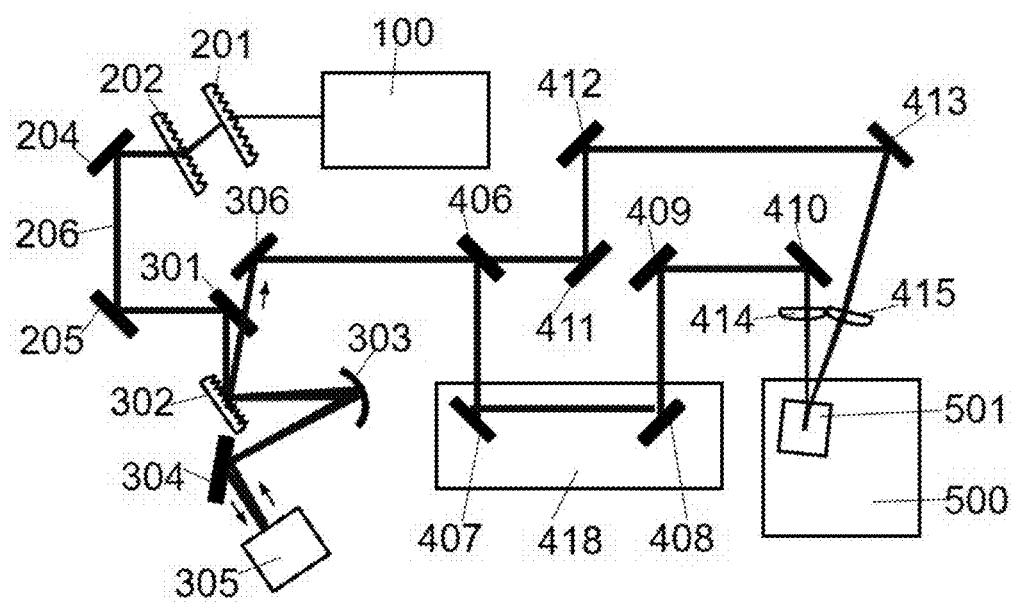
FIG. 8 is a structural diagram of an apparatus for preparing a chirped volume grating.

With reference to FIG. 8, an ultra-short pulse laser having a center wavelength of 800 nm, a pulse width of about 100 fs, and a spectral width of about 40 nm is output from a femtosecond pulse laser 100. The original femtosecond pulse is then transformed into a spatially dispersed pulse laser beam 206 with different wavelength components spatially distributed from a short wavelength to a long wavelength through a first transmission grating 201 and a second transmission grating 202. Then the spatially dispersed pulse laser beam 206 passes through the first planar mirror 204, the second planar mirror 205 and the third planar mirror 301 to change the path, and is incident on the third diffraction grating 302 to diffract and generate angular dispersion to become a plurality of beams of quasi-monochromatic light distributed in spatial lines. The third diffraction grating 302 is placed at the focal point of the concave mirror 303. The plurality of beams of quasi-monochromatic light are converted into collimated beams through the concave mirror 303, and are incident on the pulse shaping template 305 after passing through the fourth planar mirror 304. The pulse shaping template 305 modulates the time domain Gaussian distributed laser into the time domain rectangular distributed pulse laser, the modulated laser returns according to the original optical path with a small angle difference, passes through the fourth planar mirror 304, the concave mirror 303 and the third diffraction grating 302, and is finally output by the fifth planar mirror 306. The time domain rectangular distributed laser pulses are divided into a reflected beam and a transmitted beam by a beam splitting mirror 406 at an optical power ratio of one to one. After passing through the time domain delay controller, the reflected beam is changed in optical path by the twelfth planar mirror 409 and the thirteenth planar mirror 410, passes through the first plano-convex cylindrical lens 414, and converges in the glass sample 501. The time domain delay controller is composed of a tenth planar mirror 407, an eleventh planar mirror 408 and a pair of planar mirror groups, and a displacement stage 418, and is used for controlling the time domain spacing between the reflected beam and the transmitted beam, so that the two pulses converge in the glass to achieve the effect of synchronous interference. After the transmitted light beam passes through the sixteenth planar mirror 411, the seventeenth planar mirror 412, and the eighteenth planar mirror 413 to change the optical path, it is converged through the second plano-convex cylindrical lens 415 to coincide at the focal point of the two light beams in the glass sample 501. A spatially dispersed laser pulse is characterized in that photons with different wavelength components in the wavefront plane of a light spot are sequentially scattered from a short wavelength to a long wavelength in space, and two spatially dispersed laser pulses are focused in the glass sample at a certain included angle after time domain synchronization. At the focal point there is an overlap of a section with the same wavelength between several spots, and photons at different spatial distributions between spots but of the same wavelength component interfere to generate a plasma. Since the period of the plasma grating formed by the interference of photons of different wavelengths is also different, several spatially dispersed pulse laser beams form a chirped plasma grating with non-uniform periodic distribution at the focal point of the converging lens in the glass sample. The angle between the reflected beam and the transmitted beam is θ. When the time domain of the two beams of laser is synchronized, according to the interference principle, the periodic constant of the interference fringes formed satisfies the formula $D_n=\lambda_n/\sin(\theta/2)$. When different wavelength components $\lambda_n$ of the spatially dispersed pulse laser interfere in the glass sample 501, the interference fringe spacing can satisfy the formula $$D_n = \lambda_n/\sin\left(\frac{\theta}{2}\right).$$

A glass sample 501 is placed and fixed on a precise electrically controlled displacement platform 502, and the electrically controlled displacement platform 502 is controlled to enable the glass sample 501 to move along a straight line at a constant speed v=0.3 mm/s, and an included angle α between the moving direction and the plasma grating is 90°.

In this way, the chirped volume grating can be quickly etched in the glass sample 501 using the chirped plasma grating.

The above embodiments merely further elaborate the present disclosure and are not intended to limit the scope of the present disclosure. Equivalent implementations of the present disclosure shall be included within the protection scope defined the claims of the present disclosure.

What is claimed is:

1. A method for preparing a femtosecond optical filament interference direct writing volume grating or a chirped volume grating, wherein femtosecond pulse laser is configured to interfere in glass to form a section of optical filament that is several times a Rayleigh length of a light spot; a plasma, produced by multiphoton ionization of the medium caused by a femtosecond pulse laser, is controlled to rapidly scan in the glass and etch out a structure of the volume grating or the chirped volume grating by adjusting a focal length and laser energy of a focusing lens; and the femtosecond pulse laser has two or more beams, such that the two or more beams reunite at a focal point behind a converging lens after time domain synchronization to generate interference to form a plasma grating or a chirped plasma grating in the glass near the area of focal point.

2. An apparatus for preparing a femtosecond optical filament interference direct writing volume grating or a chirped volume grating, wherein the apparatus comprises a femtosecond pulse laser module, a pulse chirp management module, a pulse time domain shaping module, a laser separation and interference module, a glass volume grating processing platform module and a camera online imaging module; wherein the femtosecond pulse laser module comprises: a femtosecond laser or a picosecond laser, and an adjustable power attenuator; the pulse chirp management module comprises: a first diffraction grating, a second diffraction grating, a mirror with high reflectivity at incident angle of 0°, a first planar mirror, and a second planar mirror; the pulse time domain shaping module comprises a plurality of planar mirrors, a third diffraction grating, a concave mirror, and a pulse shaping template; the laser separation and interference module comprises a plurality of planar mirrors, an optical path collimator, a beam splitting device, a time domain delay controller and a converging lens; the glass volume grating processing platform module comprises: a glass sample and an electrically controlled displacement platform; the camera online imaging module comprises: two convex lenses, a CCD camera and a computer;

the femtosecond pulse laser generated by the femtosecond pulse laser module is incident to the pulse chirp management module; the pulse chirp management module is configured to manage the time-domain chirp or spatial dispersion of incident laser pulse; the pulse time domain shaping module is configured to manipulate incident time domain waveform to modulate the spatial distribution of formed plasma grating; an output laser from prior module is then incident to the laser separation and interference module; the laser separation and interference module is configured to separate the incident laser pulse into two or more beams, the two or more beams of pulses reunite at a focal point behind the converging lens after time domain synchronization to generate interference, and a plasma grating or a chirped plasma grating is formed in the glass near the area of focal point; the glass samples are placed on glass volume grating processing platform module; the glass volume grating processing platform module is configured to move the glass sample and scan the shape of glass volume grating etched by laser induced plasma grating or laser induced chirped-plasma grating; the camera online imaging module is configured to monitor a laser processing condition in the glass sample in real time.

3. The apparatus according to claim 2, wherein the adjustable power attenuator is a circular rotary neutral density attenuation sheet, a combination of half-wave plate and a Gland prism or a combination of half-wave plate and a polarization beam splitter.

4. The apparatus according to claim 2, wherein the first diffraction grating and the second diffraction grating in the pulse chirp management module are transmissive diffraction gratings, reflective diffraction gratings or dispersion prisms.

5. The apparatus according to claim 2, wherein the third diffraction grating in the pulse time domain shaping module is a transmission grating, a reflection grating, a volume grating or a dispersion prism.

6. The apparatus according to claim 2, wherein the pulse shaping template is an acousto-optic modulator, a liquid crystal spatial modulator, a moving mirror or a deformable mirror.

7. The apparatus according to claim 2, wherein the beam splitting device is a micro-array mirror configured to divide the pulse laser into a plurality of beams according to a power ratio, a combination of a half-wavelength wave plate and a polarization beam splitter, and a combination of one or more planar beam splitters.

8. The apparatus according to claim 2, wherein the time domain delay controller comprises a displacement stage and two planar mirrors, and is configured to adjust a time domain difference between the laser pulses to achieve time domain synchronization of a plurality of laser pulses while passing through the focal point of the converging lens.

9. The apparatus according to claim 2, wherein the converging lens is a plano-convex cylindrical lens, a double-glued cylindrical lens, a circular lens, a micro-lens array or a conical lens.

10. The apparatus according to claim 2, wherein the glass sample is a six-sided polished rectangular parallelepiped made of fused silica glass, K9 glass, calcium fluoride glass or zinc sulfide crystal.

* * * * *